(12) United States Patent
Armini

(10) Patent No.: US 7,696,273 B2
(45) Date of Patent: Apr. 13, 2010

(54) METHOD FOR IMPROVING MECHANICAL PROPERTIES OF POLYMER PARTICLES AND ITS APPLICATIONS

(75) Inventor: Silvia Armini, Terni (IT)

(73) Assignees: IMEC, Leuven (BE); Katholieke Universiteit Leuven, Leuven (KUL) (BE)

( * ) Notice: Subject to any disclaimer, the term of this patent is extended or adjusted under 35 U.S.C. 154(b) by 797 days.

(21) Appl. No.: 11/585,442

(22) Filed: Oct. 23, 2006

(65) Prior Publication Data

US 2007/0179238 A1 Aug. 2, 2007

Related U.S. Application Data

(60) Provisional application No. 60/763,273, filed on Jan. 30, 2006.

(30) Foreign Application Priority Data

Aug. 23, 2006 (EP) .................................. 06119423

(51) Int. Cl.
*C08K 3/34* (2006.01)
(52) U.S. Cl. ...................... 524/493; 524/556; 524/567; 524/543
(58) Field of Classification Search ................. 524/493, 524/556, 567, 543
See application file for complete search history.

(56) References Cited

U.S. PATENT DOCUMENTS

2004/0144755 A1 7/2004 Motonari et al.
2005/0227451 A1* 10/2005 Konno et al. ................ 438/424

* cited by examiner

*Primary Examiner*—David Wu
*Assistant Examiner*—Michael M Bernshteyn
(74) *Attorney, Agent, or Firm*—Knobbe Martens Olson & Bear LLP

(57) ABSTRACT

A method for improving the mechanical hardness of polymer particles is provided, the method comprising subjecting the polymer particles to a thermal cycle of heating and subsequently cooling. The method is applicable for use with combinations of preferably three monomers, the monomers having hydrophilic and hydrophobic groups in their polymer chain in order to achieve preferential orientation of the polymer chains in a polar solvent after applying the heating cycles of the invention (for example, but not limited to, polymethylmethacrylate and polystyrene based terpolymers and copolymers). Polymeric abrasives used in slurry compositions for polishing copper and their use in a chemical mechanical polishing method are also provided.

10 Claims, 11 Drawing Sheets

METHOD FOR IMPROVING MECHANICAL PROPERTIES OF POLYMER PARTICLES AND ITS APPLICATIONS

CROSS-REFERENCE TO RELATED APPLICATION

This application claims the benefit under 35 U.S.C. §119 (e) of U.S. provisional application Ser. No. 60/763,273, filed Jan. 30, 2006, and claims the benefit under 35 U.S.C. §119 (a)-(d) of European application No. 06119423.9, filed Aug. 23, 2006, the disclosures of which are hereby expressly incorporated by reference in their entirety and are hereby expressly made a portion of this application.

FIELD OF THE INVENTION

The preferred embodiments relate to the field of polymer-based particles. More specifically they relate to a method to alter the morphological and mechanical properties of polymer particles and its applications.

The preferred embodiments further relate to the field of semiconductor processing. More specifically they relates to the chemical mechanical polishing (CMP) process using polymer particles as abrasive particles.

BACKGROUND OF THE INVENTION

Integration of copper into an IC manufacturing process can be implemented by using dual damascene processing, in which Chemical Mechanical Polishing (CMP) has been used to remove the overburden material and planarize the wafer surface.

CMP is the best approach for copper interconnects layers to obtain global planarization, while the slurry is the most important and critical factor in the polishing process. The slurry for copper CMP is composed of abrasive particles and chemicals such as inorganic or organic acids, corrosion inhibitors, oxidizers and complexing agents. The inorganic particles used such as abrasives have high removal rate (RR), but they are hard and they can create many scratches and damages not only on copper but also on the silica film surface.

SUMMARY OF THE INVENTION

In order to fully planarize soft materials it is necessary to develop new abrasive particles polymer-based particles.

Untreated polymer abrasives have been tested for resist polishing, but their removal rate as such for other materials such as copper and low-k materials that are harder than polymeric resist, is not enough. Additions of aggressive chemicals such as oxidizing agents to help the removal of these harder materials and higher down force can improve the polishing process but leads to more defectivity such as corrosion (for metals) and mechanical damage. The use of a harder pad in combination with the chemicals can improve the removal efficiency but is preferably avoided for easy damageable surfaces.

To solve these shortcoming of polymer particles, so called composite abrasives have been developed whereby the polymer particle (core) is coated with an inorganic silica shell to improve the hardness of the abrasive. The polymer core gives the advantage of being compressible. An example of the composite abrasives is described in US 2004/0144755. The polymer core of the composite abrasives creates a cushion effect at areas of high local down-force; however the presence of the inorganic shell can still create scratches on easy damageable surfaces such as copper and low-k materials commonly used in semiconductor processing.

Another approach could be increasing the down force on the wafer carrier, in order to increase material removal rates but this is likely to cause damages, scratches, delamination or destruction of material layers on the wafer, which is especially the case for low-k dielectric materials.

Accordingly, it is desirable to solve the shortcomings of the commercial available polishing slurries containing polymer particles by improving the mechanical properties of the polymer particles, which makes it possible to polish e.g. Cu structures in semiconductor devices avoiding damage.

It is also desirable to provide a method to alter the structure or morphology of polymer based particles, or in other words, altering the macromolecular and supra-molecular structure of polymer particles.

The preferred embodiments relate to a method to increase the mechanical hardness of polymer particles, the polymer particles comprising hydrophilic and hydrophobic groups, comprising the step of submitting the particles contained in a polar solvent, to a thermal cycle consisting of at least one heating step followed by at least one cooling step.

In a preferred embodiment, the polymer particles are preferably copolymer and/or terpolymer particles.

Preferably, the temperature is provided such that the glass transition temperature (Tg) of the copolymer or terpolymer particles is reached, and even more preferably exceeded, during the at least one heating step. The temperature can be up to maximum 300° C. during the at least one heating step and down to minimum 10° C. during the at least one cooling step. Preferably the temperature is up to maximum 200° C. during the at least one heating step and down to minimum 20° C. during the at least one cooling step.

In a preferred embodiment, the thermal cycle can be performed in a closed reactor to avoid evaporation of the solvent.

Preferably, the temperature is increased at a rate of 5° C. per minute to 10° C. per minute during the at least one heating step.

Preferably, the temperature is decreased at a rate of 15° C. per minute to 30° C. per minute during the at least one cooling step.

In a preferred embodiment, the polar solvent is preferably water.

The polymer particles can comprise (or consist of) polymethylmethacrylate, polystyrene, polypropylene, polyvinylchloride, polyisobutylene and/or acrylate.

Preferably, the polymer particles comprise (or consist of) methylmethacrylate and methoxypolyethylenglycol-methacrylate.

More preferably, the polymer particles are terpolymer particles consisting of methylmethacrylate, methoxypolyethylenglycolmethacrylate and 4-Vinylpyridine.

A method according to a preferred embodiment can further comprise, after the thermal cycle, a step of coating the copolymer and/or terpolymer particles with an inorganic shell or compound.

Preferably, the inorganic shell is silica.

In a preferred embodiment, a polymer particle is provided, more particularly a copolymer or a terpolymer particle, obtainable by a method according to preferred embodiments.

The copolymer or the terpolymer particle can exhibit an elastic moduli (E) (higher than 4 GPa and a hardness higher than 0.25 GPa.

The elastic moduli (E) is determined from nanoindentation measurements made by means of a nanoindenter or by atomic force microscopy (AFM)); and the hardness is measured by means of a nanoindenter.

Also provided is a polishing slurry composition for use in chemical mechanical polishing, comprising polymer particles obtainable by a method according to a preferred embodiment.

The polymer particles obtainable can be used as abrasive particles, either in dry state or in wet state.

The polymer particles obtainable by a method according to the preferred embodiments can be used for polishing layers of semiconductor devices, such as copper layers, low-k dielectric layers (i.e. layers of dielectric constant k lower than 3.9), photosensitive layers, or semiconductor wafer substrates.

BRIEF DESCRIPTION OF THE DRAWINGS

All drawings are intended to illustrate some aspects and embodiments of the present invention. Not all alternatives and options are shown and therefore the invention is not limited to the content of the given drawings.

DETAILED DESCRIPTION OF THE PREFERRED EMBODIMENTS

Figure 1A:
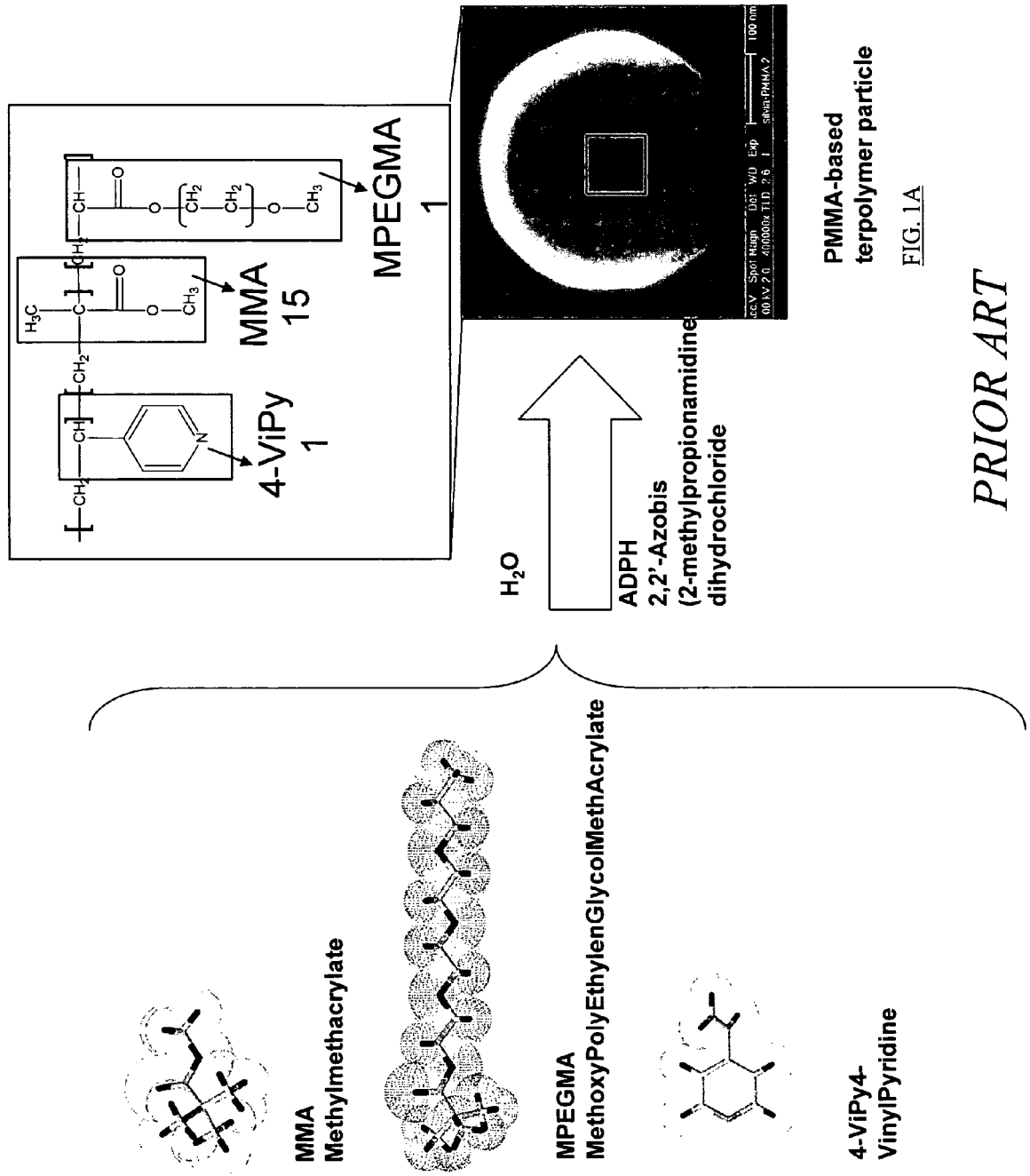
FIG. 1A (PRIOR ART) illustrates the synthesis of PMMA-based terpolymer particles used as starting point for further synthesis of the polymer particles of the preferred embodiments.
Figure 1B:
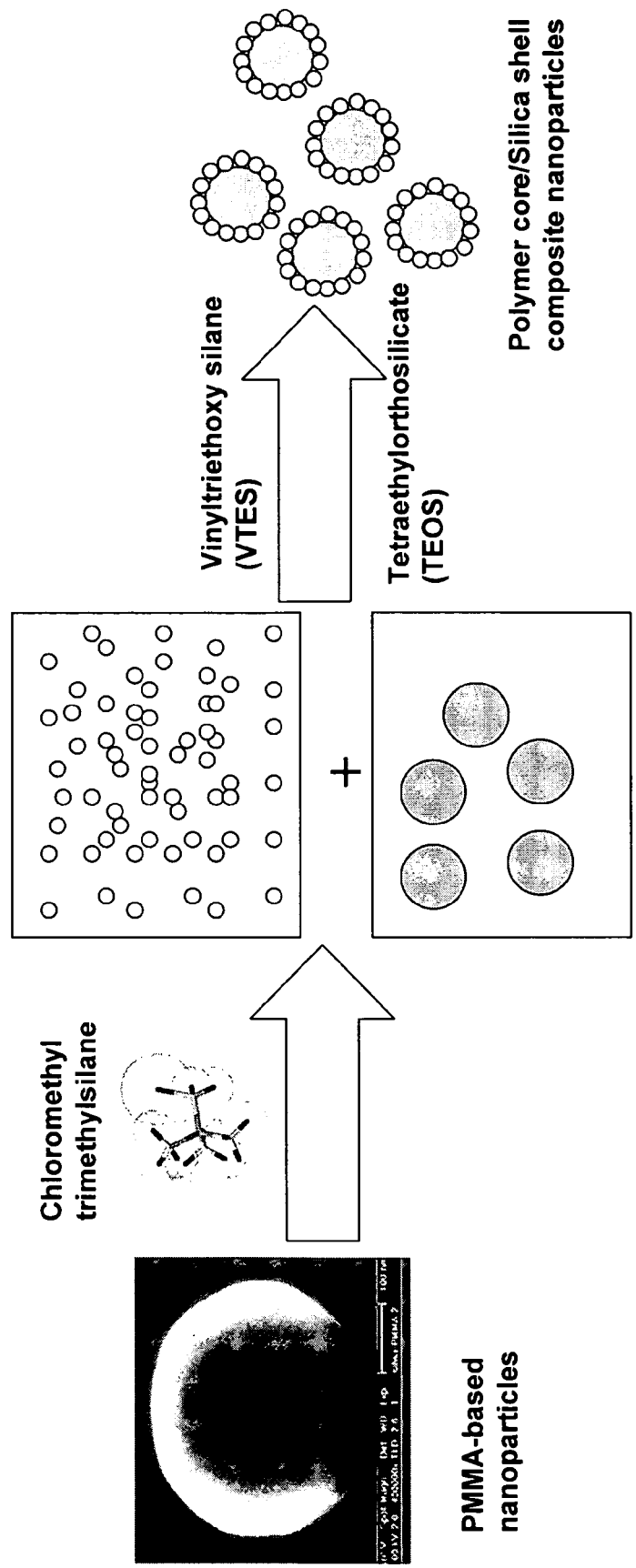
FIG. 1B (PRIOR ART) illustrates the synthesis of composite abrasive polymer particles having a polymer core and silica shell with a silane-coupling agent at the interface.

The preferred embodiments provide a method for improving the mechanical properties such as hardness and elastic modulus of polymer particles.

More particularly, a method according to the preferred embodiments for improving the mechanical properties, in particular the hardness, of polymer particles comprises the step of submitting polymer particles, preferably copolymer and/or terpolymer particles, contained in a polar solvent, the particles comprising hydrophilic and hydrophobic groups, to at least one thermal cycle, each thermal cycle consisting of at least one heating step followed by at least one cooling step.

A method according to the preferred embodiments allows to improve the mechanical properties of polymer particles without (substantially) altering the size and/or shape of the polymer particles.

A method of the preferred embodiments also allows to improve the mechanical properties of polymer particles without (substantially) altering the original size distribution of the particles.

In the context of the preferred embodiments, polymer particles can refer to homopolymers or heteropolymers.

A copolymer generally refers to the product of polymerization of at least two different types of monomer, but in the context of the preferred embodiments, a copolymer refers to the product of polymerization of exactly two different types of monomer. A terpolymer refers to the product of polymerization of exactly three different types of monomer. The term "heteropolymer(s)" is meant to encompass copolymers, terpolymers and polymers resulting from the polymerization of more than three different types of monomer.

In the context of the preferred embodiments, the term "crystalline" with respect to the polymer particles obtained by a method of the preferred embodiments, refers to a semi-crystalline morphology consisting of (increased) crystalline and amorphous phases. The crystalline phase consists in more ordered domains where the polymer chains orientate themselves in the minimum energy conformation imparting a specific tacticity to the structure.

The polymer particles as described and used in the preferred embodiments are preferably a combination of two different types of monomer (referred to as copolymer(s)) and/or a combination of three different types of monomer (referred to as terpolymer(s)).

The monomers in the polymers, more particularly in the copolymers, or in the terpolymers, comprise a combination of hydrophobic and hydrophilic groups.

Preferably, the monomers used in a method according to the preferred embodiments comprise a vinyl group.

Monomers comprised in the polymers, in particular in the copolymers and/or terpolymers, to be used in a method of the preferred embodiments can be selected from the group consisting of (meth)acrylic acid, acrylamide, methacrylamide, alkyl-(meth)-acrylates having 1 to 24 carbon atoms in the alkyl group, vinyl aromatic monomers (e.g. vinyl pyridine, alkyl vinyl pyridine, vinyl butyrolactam, vinyl caprolactam), monocarboxylic acid, dicarboxylic acid, itaconic acid, substituted vinyl aromatic monomers, olefins (e.g. propylene, isobutylene, or long chain alkyl olefins having 10 to 20 carbon atoms), vinyl alcohol esters (e.g. vinyl acetate, vinyl stearate), vinyl halides (e.g. vinyl fluoride, vinyl chloride, vinylidene fluoride), and vinyl nitriles (e.g. acrylonitrile, methacrylonitrile).

A copolymer or a terpolymer to be used in a preferred embodiment can result from the polymerization of:
- (meth)acrylic acid with acrylamide or methacrylamide,
- (meth)acrylic acid with styrene or with other vinyl aromatic monomers,
- alkyl(meth)acrylates (esters of acrylic or methacrylic acid) with a mono or dicarboxylic acid, such as, acrylic or methacrylic acid or itaconic acid,
- substituted vinyl aromatic monomers having substituents, such as, halogen (i.e. chlorine, fluorine, bromine), nitro, cyano, alkoxy, haloalkyl, carboxy, amino, amino alkyl with an unsaturated mono or dicarboxylic acid and/or an alkyl(meth)acrylate,
- monoethylenically unsaturated monomers containing a nitrogen ring, such as, vinyl pyridine, alkyl vinyl pyridine, vinyl butyrolactam, vinyl caprolactam, with an unsaturated mono or dicarboxylic acid;
- olefins, such as, propylene, isobutylene, or long chain alkyl olefins having 10 to 20 carbon atoms with an unsaturated mono or dicarboxylic acid,
- vinyl alcohol esters, such as, vinyl acetate and vinyl stearate and/or vinyl halides, such as, vinyl fluoride, vinyl chloride, vinylidene fluoride and/or vinyl nitriles, such as, acrylonitrile and methacrylonitrile with an unsaturated mono or dicarboxylic acid,
- alkyl(meth)acrylates having 1 to 24 carbon atoms in the alkyl group and an unsaturated monocarboxylic acid, such as, acrylic acid or methacrylic acid.

Preferably two or three monomers of different hydrophobicity are used (respectively for a copolymer and a terpolymer to be used in a method of the preferred embodiments) in order to have preferential orientations in water, after the thermal cycle(s), for example, but not limited thereto, polymethylmethacrylate and polystyrene based copolymers and terpolymers.

Preferably, the polymer particles comprise (or consist of) polypropylene, polyvinylchloride, polyisobutylene and/or acrylate.

A preferred copolymer to be used (as starting polymer particles for the thermal cycle(s)) in a method of the preferred embodiments results from the polymerization of methylmethacrylate (MMA) and methoxypolyethylenglycolmethacrylate (MPGEMA).

A preferred terpolymer to be used (as starting polymer particles for the thermal cycle(s)) in a method of the preferred embodiments results from the polymerization of methylmethacrylate (MMA), methoxypolyethylenglycolmethacrylate (MPGEMA), and vinyl-pyridine (more particularly 4-vinyl-pyridine).

A method of the preferred embodiments comprises a thermal treatment, more particularly a thermal cycle consisting of successively heating and cooling. The thermal cycle can comprise (or consist of) at least one heating step followed by at least one cooling step. The thermal cycle can comprise (or consist of) one heating step (immediately) followed by one cooling step (immediately) followed by one heating step. Preferably, the thermal cycle comprises (or consists of) one heating step immediately followed by one cooling step.

To obtain reorientation within the polymer particles, at least one heating and cooling cycle is required. Optionally, the heating and cooling cycle (i.e. the thermal cycle) can be repeated once, twice or more.

The temperature during the heating and cooling procedure varies preferably in the range of minimum 10° C. and maximum 300° C. and more preferred between room temperature (about 20° C.) and 200° C.

The temperature to be reached during the heating step is preferably above the glass transition temperature (Tg) of the polymer particles. Tg is the temperature at which an amorphous polymer (or amorphous regions in a partially crystalline polymer) changes from a hard and relatively stable condition to a viscous or rubbery condition.

The thermal treatment is intentionally applied to give enough thermal energy in order to overcome the activation energy barrier to achieve a different conformation of the polymer chain. The different conformation is preferably a more ordered crystalline structure.

Preferably, the temperature during the heating step reaches the glass transition temperature ($T_g$) of the copolymers and/or terpolymers; and in case of a mixture of different polymers, the temperature during the heating step preferably reaches at least the lowest $T_g$, and more preferably the highest $T_g$. In particular, the temperature used in the heating step is preferably up to maximum 300° C., more preferably up to maximum 200° C.

Preferably, the cooling step is down to minimum 10° C., more preferably down to minimum 20° C.

More preferred the thermal cycle comprises one heating step up to maximum 200° C. followed by one cooling step down to minimum 20° C.

Even more preferably, the thermal cycle comprises one heating step herein the temperature is raised beyond the Tg of the polymers, more particularly of the copolymers and/or the terpolymers, and up to (about) 200° C., followed by one cooling step down to the room temperature (i.e. about 20° C.).

During the thermal treatment, the alternating hydrophobic and hydrophilic groups in the individual monomer chains can reorient themselves in the presence of a polar solvent. The thermal treatment is therefore performed in the presence of a polar solvent (i.e. any suitable solvent the dipole moment of which is different from and higher than 0) such that the polymer chains of the individual monomers can be reordered and crystallization of the copolymer or terpolymer based polymer particles can take place.

Preferred examples of polar solvents are alcohols (e.g. methanol, ethanol), acetone, and more preferably water.

Preferably, the thermal cycle comprises a slow heating step followed by a rapid cooling step. By slow heating step it is meant heating at a rate comprised preferably between about 5° C./min and about 10° C./min (less than 5° C./min, and also 6° C./min, 7° C./min, 8° C./min, 9° C./min, 11° C./min, or 12° C./min being envisaged in a method of the preferred embodiments), to favour the reorientation of the polymer chain.

For an optimal method of the preferred embodiments, the temperature reached during the heating step should be at least (few degrees, i.e. 1, 2, 3, 10, or more) above the glass transition temperature (Tg) of the polymers.

Preferably the slow heating step is followed by a rapid cooling step such that the altered conformation is blocked, the altered conformation is preferably corresponding to a more crystalline state and leading to improved mechanical properties.

By rapid cooling step is meant cooling at a rate of approximately 15° C./min up to 20° C./min. Cooling at a rate of 14° C./min, 16° C./min, 17° C./min, 18° C./min, 19° C./min or 21° C./min or more is also envisaged in a method of the preferred embodiments.

A method of the preferred embodiments can also be defined as a method for fabricating polymers, more particularly new copolymer and/or terpolymer particles, comprising the step of polymerizing (suitable) monomers as defined herein and the step of submitting the particles obtained to a thermal cycle as defined herein.

Preferably, the thermal cycle comprises at least one heating step wherein the temperature is raised beyond the $T_g$ of the polymer particles obtained in the previous step, followed by at least one cooling step wherein the temperature is decreased down to the room temperature (i.e. about 20° C.).

More preferably, the thermal cycle consists of one heating step, wherein the temperature is raised beyond the $T_g$ of the polymer particles, preferably at a rate of less than about 10° C./min, and one cooling step, wherein the temperature is decreased down to room temperature, preferably at a rate of more than about 15° C./min.

The polymer particles of the preferred embodiments have several additional advantages compared to untreated polymer particles such as stability towards pH.

To stabilize the polymer particles of the preferred embodiments in solution, no surfactant needs to be added.

Addition of cationic surfactant even in very low concentration (trace amount), leads to polymer particles with a positive zeta potential such that the influence of pH (or in other words change in pH) has a great impact on the behavior of the particles.

The method of the preferred embodiments does not need the use of surfactants during synthesis or treatment because monomers are chosen with altering hydrophilic and hydrophobic groups. The obtained (treated) polymer particle itself acts as a micelle-like structure.

In accordance with a method of the preferred embodiments, the thermal cycle of heating and cooling offers advantages in respect to known state of the art processes used for improving the mechanical properties of the particles (such as elastic modulus or hardness) which may change the size, size distribution or shape of the particles. For example, using a cross-linker during the synthesis makes it very difficult to achieve high monodispersity in the particle size.

To the contrary, a method of the preferred embodiments makes it possible to achieve a high monodispersity in particle size of the particles obtained.

The high monodispersity preferably refers to particles having a standard deviation on the average size (or diameter) of about 5-10%. In other words, the particles preferably exhibit uniformity in size (or diameter) of more than about 90% and more preferably of more than about 95%.

The size of the polymer particles obtained by the preferred embodiments can span from hundreds of nanometers to microns.

During the thermal treatment/cycle(s) of the preferred embodiments, the initial size (distribution) of the polymer particles is not substantially altered.

The initial size of polymer particles can however be tuned during synthesis by parameters such as the monomer content, synthesis temperature and the type of initiator.

Different types of polymer particles can be used in a method according to the preferred embodiments to obtain the polymer particles of the preferred embodiments.

Preferably the starting polymer particles are made of copolymers and/or terpolymers wherein the monomers comprise hydrophilic and hydrophobic groups.

Rising the temperature during the heating phase/step gives the necessary energy to overcome the activation barrier for the rotation and reorganization of the polymer chains; and in the rapid cooling phase the reorganization is immobilized towards the actual energetically more stable conformation.

The effect of reorganization of the chains within the polymer particles during the thermal treatment is only possible in the presence of a polar solvent, preferably water, because of its specific interactions with the hydrophilic groups of the individual monomers constituting the polymer particles. The interaction leads to a reorientation of the groups towards the polar solvent and hence towards the external side of the polymer particle.

It has been observed that the polymer particles obtained by a method according to the preferred embodiments (and also an advantage of one or more preferred embodiments) exhibit a semi-crystalline morphology consisting of crystalline and amorphous phases. The crystalline phase consists in more ordered domains where the polymer chains orientate themselves in the minimum energy conformation imparting a specific tacticity to the structure.

The mechanical properties of the polymers are largely determined by their degree of crystallinity and by the orientation of the chains in the polymers.

In the preferred embodiments the re-orientation of the polymer chains is achieved by the interactions of the polymer chains with the solvent molecules during the thermal treatment/cycle. Indeed, the polarity (or hydrophilicity) of the solvent is important to induce interactions with the hydrophilic segments of the polymer. A preferred example of a polar solvent to be used is water. Further examples of polar solvents are alcohols such as methanol and/or ethanol.

The polymer particles of the preferred embodiments can be coated with an inorganic compound to obtain composite polymer particles.

The polymeric particles (in particular the copolymers and/or terpolymers and also the composite polymeric particles) of the preferred embodiments can be used as abrasives (also referred to as polymeric abrasives) for chemical mechanical polishing (CMP).

The composite polymeric particles, the copolymers and/or terpolymers, obtained by a method of the preferred embodiments are particularly suitable for easily damageable surfaces such as copper and low-k materials (i.e. dielectric constant k lower than 3.9).

The polymeric particles of the preferred embodiments present better mechanical properties compared to inorganic hard abrasives such as silica, alumina or ceria.

The micromechanical processes of deformation occurring in response to an external mechanical load, such as the down force acting during the CMP process, are much more flexible for polymeric abrasives of the preferred embodiments compared to hard inorganic abrasives, conferring to polymer particles of the preferred embodiments strong advantages for some applications such as CMP, compared to state of the art particles.

The polymeric abrasives of the preferred embodiments can be used in polishing slurry.

The polishing slurry is also provided in preferred embodiments.

A polishing slurry of the preferred embodiments can further comprise any suitable compound(s) or additive(s) known from the skilled person, such as oxidizing agents, anti-corrosive agents, and/or surfactants.

Alternatively, the polymer particles (or polymer abrasives) of the preferred embodiments can be added to an existing commercially available CMP polishing slurry for improving the performance of the slurry.

Alternatively chemicals such as oxidizers can be encapsulated within the core of the polymer particles such that during down force on these particles, e.g. during the CMP process, these chemicals are gradually released.

The polymer particles of the preferred embodiments can also be used within a post-CMP cleaning solution or post-CMP cleaning slurry.

The post-CMP slurry or post-CMP solution (also an advantage of at least one preferred embodiment) can be applied after the (Cu) CMP process.

A post-CMP cleaning solution or post-CMP cleaning slurry according to the preferred embodiments can be used to remove remaining and/or unwanted products after a CMP process.

A Cu-CMP process is normally performed on a multi-platen CMP tool to optimize the throughput and planarity of the wafers. The first platen is used primarily for removal of the unwanted Cu above the patterned and etched features. Once the bulk material has been removed, the wafers are transferred to Platen 2 where the residual (Cu) and barrier metal are removed simultaneously using a non-selective slurry. Finally, the wafers are subjected to a buffing step on platen 3 to smooth the surface, as well as to remove any remaining barrier metal. This CMP's subsequent rinsing and buffing step is aimed at minimizing micro-scratch generation and increasing the planarity. The applied down force in this case is very low and a soft pad is preferably used.

A soft polymer-based slurry (a slurry comprising polymer particles according to the preferred embodiments) shows enhanced removal rate with respect to a conventional post CMP cleaning slurry, resulting in a substantial improvement of this final buffing step.

According to a preferred embodiment, terpolymer particles (also referred to as "TER-P") resulting from the polymerization of methylmethacrylate (MMA), methoxypolyethylenglycolmethacrylate (MPEGMA) and 4-Vinylpyridine (4ViPy) are used as starting polymers in a method according to the preferred embodiments.

The ratio of MMA/MPEGMA/4-ViPy can be respectively from 2/1/1 to 30/1/1.

Preferably, the ratio of MMA/MPEGMA/4-ViPy is respectively 15/1/1.

Alternatively and also preferred, copolymer particles resulting from the polymerization of MMA and MPEGMA monomers can be used as starting polymer particles of a method according to the preferred embodiments.

The preferred terpolymer and copolymer particles show during the thermal treatment/cycle, in water, an additional shoulder in the heat capacity at approximately 130° C., shortly above their glass transition temperature ($T_g$).

The thermal treatment in a method of the preferred embodiments generates an increase of the crystallinity of the polymer particles due to a re-orientation of the polymer chains. The hydrophilic groups orientate towards the polar molecules of the polar solvent, and the thus obtained re-orientation is a more ordered structure leading to a more crystalline structure with increased mechanical properties. Indeed, mechanical properties of the polymer particles are largely determined by the degree of crystallinity present in the polymer particles and by the orientation of the polymer chains in the polymer particles.

Differential scanning calorimetry (DSC) can be used to perform the thermal treatment and analysis of the polymer particles of the preferred embodiments on a lab scale.

Other techniques can be used to perform the thermal treatment on larger scale such as closed reactors with temperature control that can withstand the pressure build up during heating.

Figure 2:
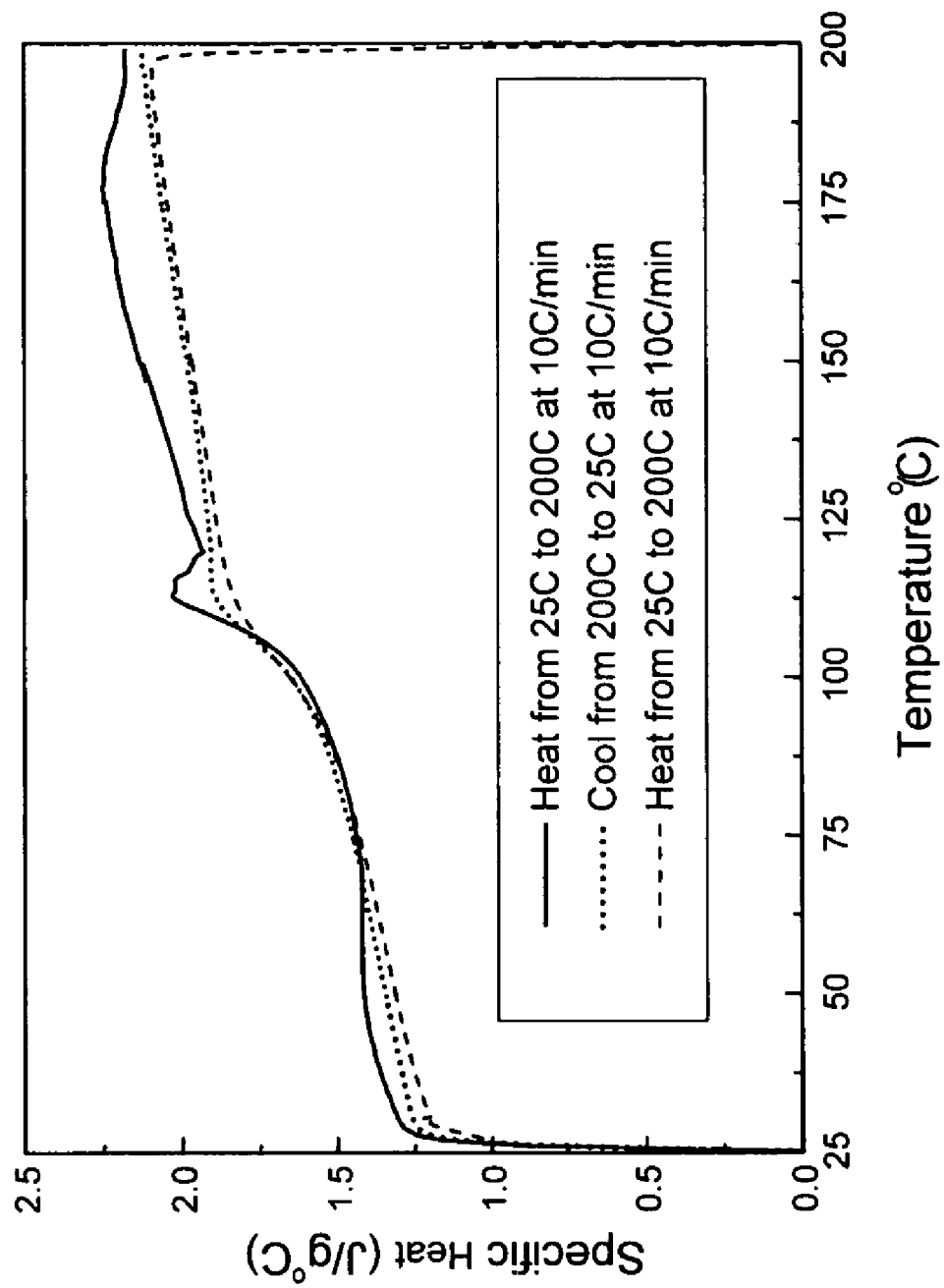
FIG. 2 shows differential scanning calorimetry (DSC) curves of methylmethacrylate (MMA)—methoxypolyethylene glycol methacrylate (MPEGMA)—4-Vinylpyridine (4-ViPy) terpolymer with ratio 15/1/1 (TER-P) in a dry powder formulation.

DSC curves established for the TER-P polymer particles in a dry state (dry powder formulation) are shown in FIG. 2. No crystallization of the TER-P polymer particles can be observed after a thermal cycle consisting of a heating step from 25° C. to 200° C. at 10° C./min, followed by a cooling step from 200° C. to 25° C. at 10° C., followed by a second heating step from 25° C. to 200° C. at 10° C./min.

Figure 3:
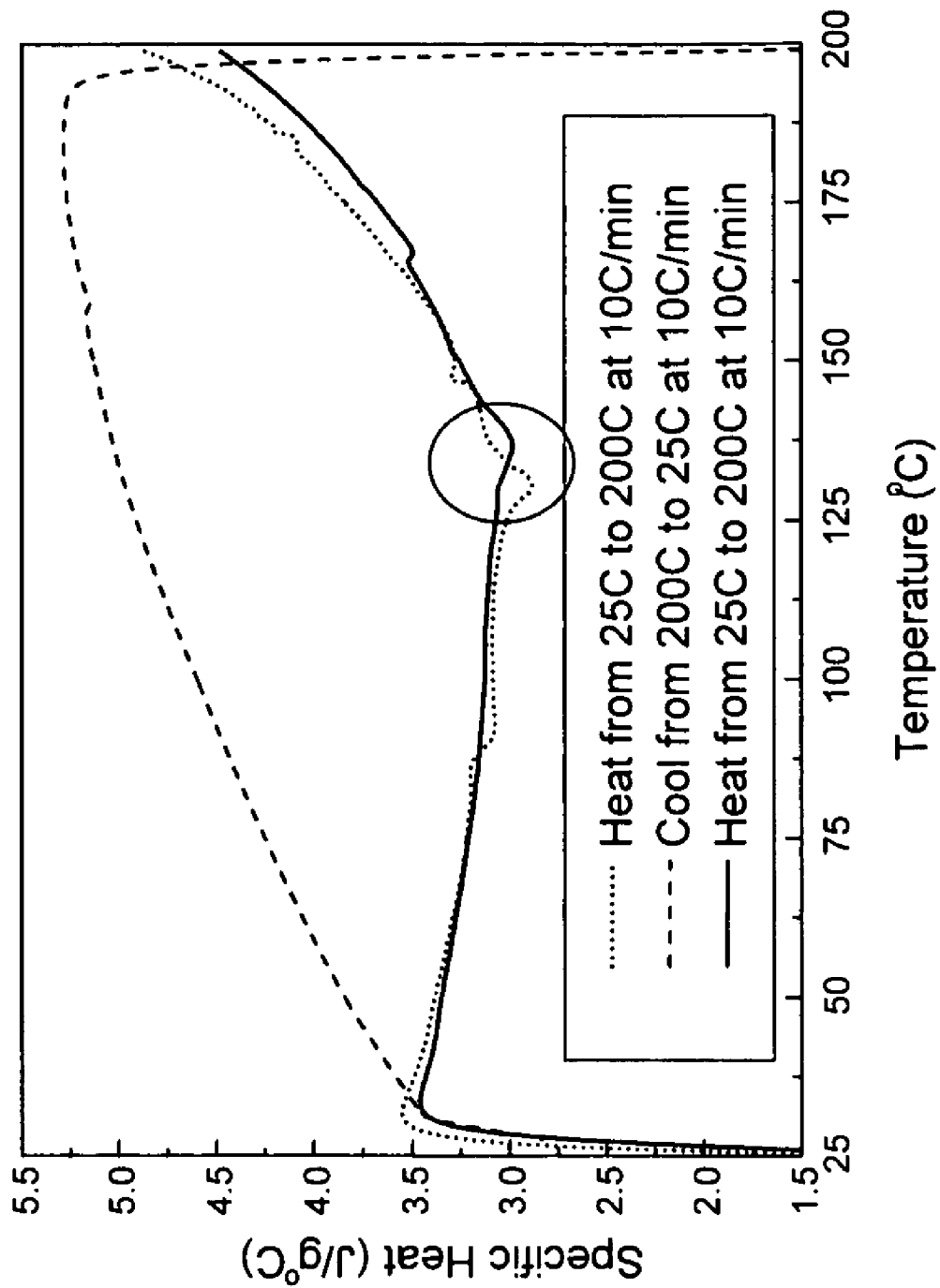
FIG. 3 shows differential scanning calorimetry (DSC) curves of methylmethacrylate (MMA)—methoxypolyethylene glycol methacrylate (MPEGMA)—4-Vinylpyridine (4-ViPy) terpolymer with ratio 15/1/1 (referred to as "TER-P") in water after the thermal treatment of the preferred embodiments.

In FIG. 3, DSC curves are established for the TER-P polymer particles in colloidal solution (or in other words having the polar solvent available). FIG. 3 shows a crystallization exothermic peak at 130° C. during the same thermal cycle as applied for FIG. 2.

In other words, crystallization occurs only for the TER-P polymer particles having the polar solvent (water) present in the pan. And where there is no solvent available in the DSC pan (dry polymer particles) during the thermal treatment (and measurement) no reordering of the polymer chains occurs.

Figure 4:
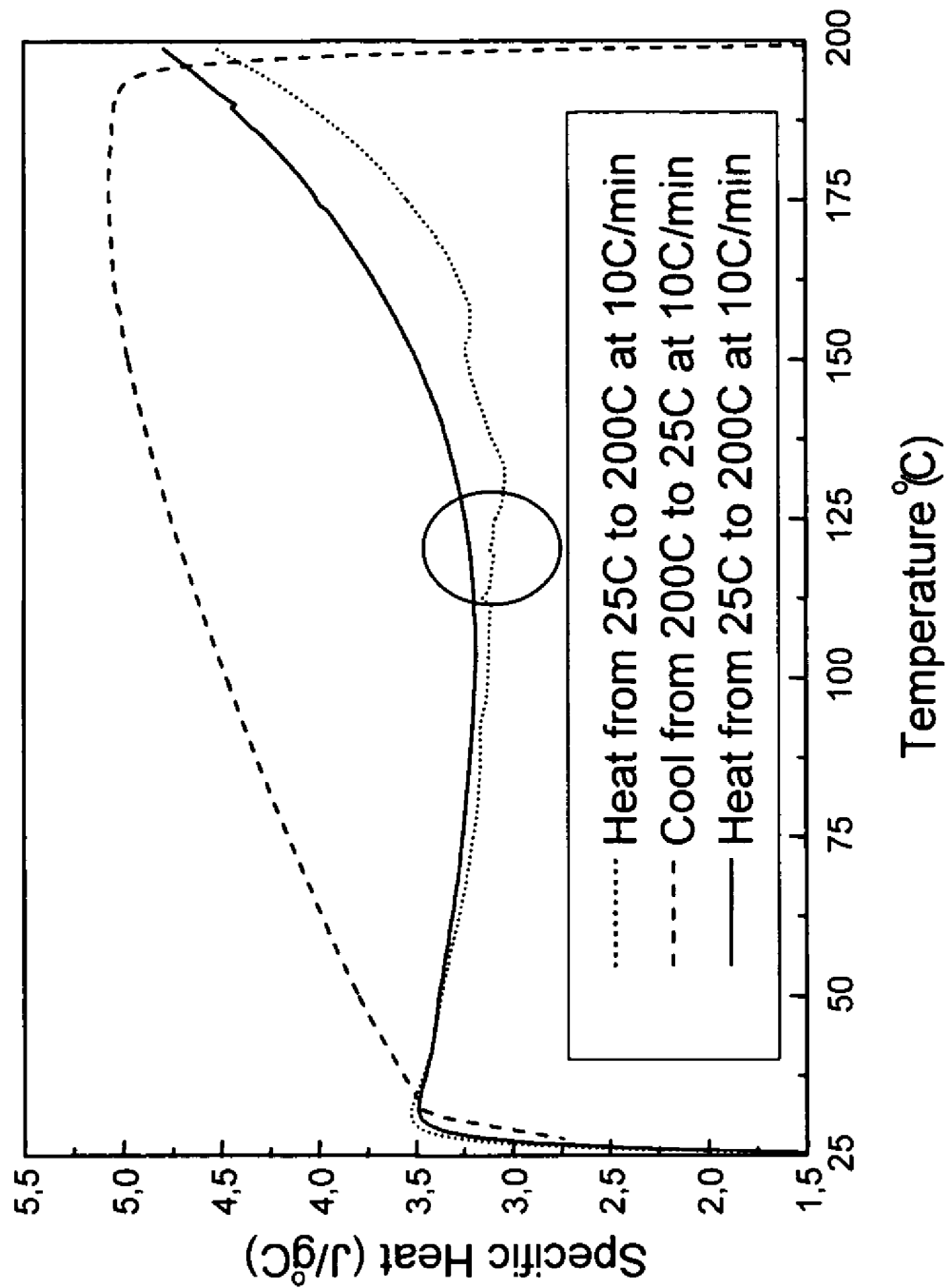
FIG. 4 shows differential scanning calorimetry (DSC) curves of methylmethacrylate (MMA)—methoxypolyethylene glycol methacrylate (MPEGMA) copolymer (referred to as "CO-P") in water.
Figure 5:
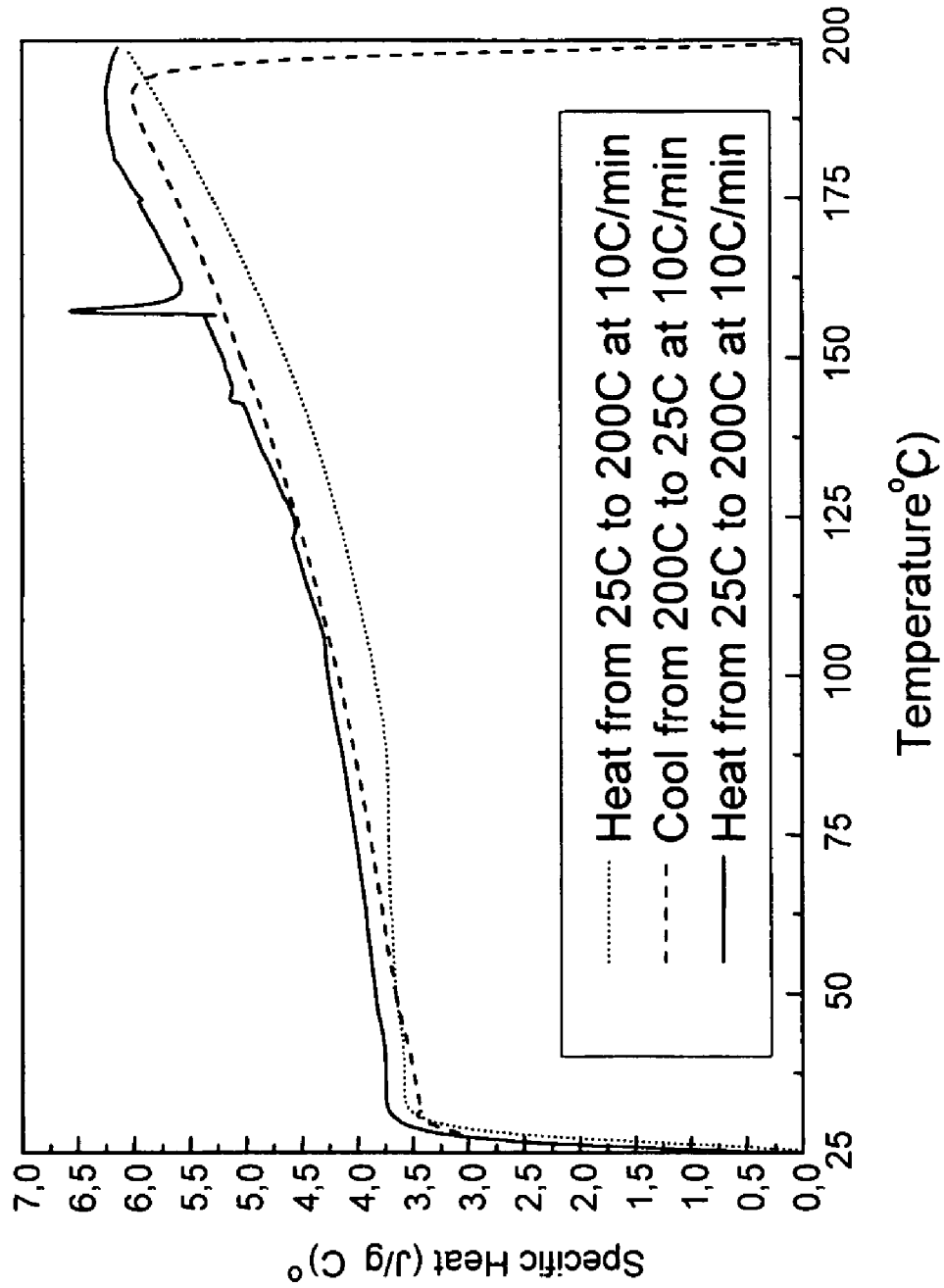
FIG. 5 shows differential scanning calorimetry (DSC) curves of methylmethacrylate (MMA)—methoxypolyethylene glycol methacrylate (MPEGMA)—4-Vinylpyridine (4-ViPy) terpolymer synthesized in presence of the cationic surfactant cetyltrimethylammonium hydrogen sulfate (CTAHS) (referred to as "TER-P-S") in water.

To a minor extent, the same effect of crystallization can be observed in the curve for the CO-P polymer particles in water, submitted to a thermal cycle as shown in FIG. 4; and no effect of crystallization is observed in the presence of surfactant as shown in FIG. 5.

Figure 6A:
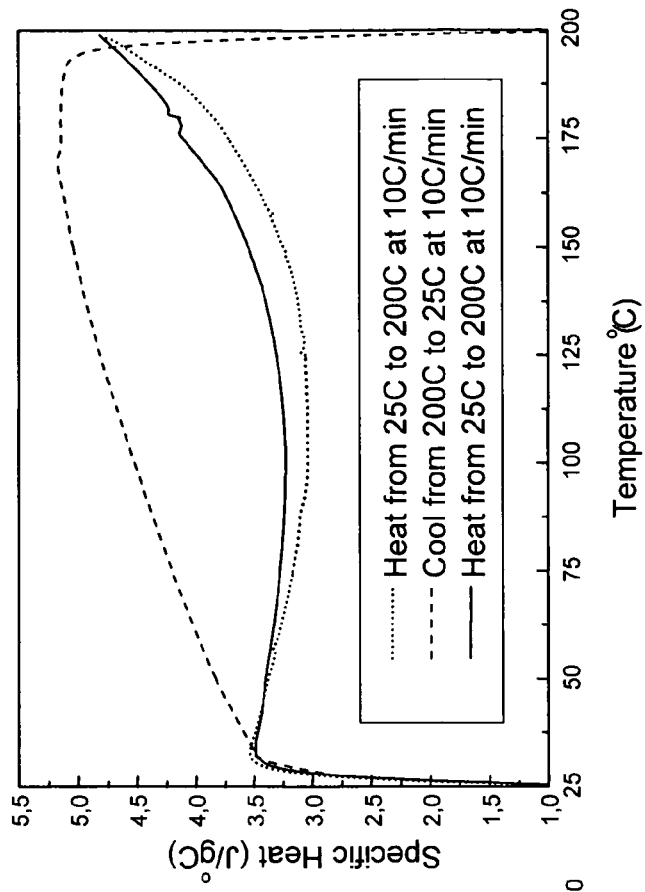
FIG. 6A shows differential scanning calorimetry (DSC) curves of "TER-P" with a continuous "raspberry-like" coating made by silica particles (diameter=30 nm) achieved with silane coupling agent at the interface between the core and the shell (referred to as "TER-C-A") in water.
Figure 6B:
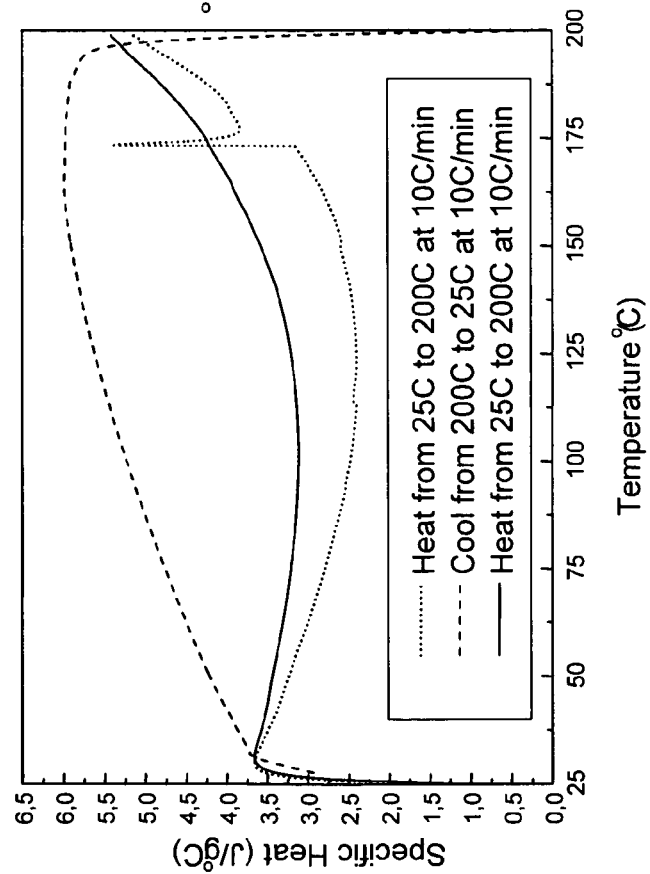
FIG. 6B shows differential scanning calorimetry (DSC) curves of "TER-P" with a continuous "raspberry-like" coating made by silica particles (diameter=30 nm) achieved without silane coupling agent at the interface between the core and the shell (referred to as "TER-C-B") in water.

There is no crystallization observed when the polymer particle (core) is coated by a silica shell and then submitted, in water, to a thermal cycle, as shown in FIG. 6A (for the TER-C-A) and FIG. 6B (for the TER-C-B).

The polymer particles obtained after the thermal cycle(s) of heating and cooling can find application in the challenging chemical mechanical planarization (CMP) of softer and easily damageable new materials, such as Cu and Low-k materials, introduced in the integrated circuit (IC) manufacturing industry.

The polymer particles of the preferred embodiments are preferably used to tune the polishing mechanism in order to be less mechanical (or in other words more compressible after using a down force) compared to the current state of the art CMP processes involving inorganic hard abrasives such as silica, alumina or ceria.

For use in Chemical Mechanical Polishing, the polymer particles of the preferred embodiments having a reorganized structure after thermal treatment can be used as such or added to a polishing slurry.

The polymer particles are preferably used in the presence of a solvent or in other words in a "wet" state or as a water-based composition since the mechanical properties are then maximally enhanced.

The polishing slurry is preferably used for polishing copper and/or easily damageable surfaces on semiconductor substrates.

Additives such as oxidizing agents and/or surfactant and/or anti-corrosive agents can be further added to the polishing slurry to improve the performance of the slurry.

In an alternative and also preferred embodiment, the polymer particles of the preferred embodiments can be further coated with an inorganic coating, the coating being performed after the thermal treatment.

For example the "TER-P" polymer particles can be coated with a continuous "raspberry-like" coating made by silica particles (diameter=30 nm). This coating can be achieved with (referred to as "TER-C-A") and without (referred to as "TER-C-B") silane coupling agent at the interface between the core (polymer) and the shell (silica).

Copolymer and/or terpolymer particles obtained by a method according to the preferred embodiments, in a dry state (i.e. no solvent present), exhibit an elastic moduli (E) higher than 6 GPa and a hardness higher than 0.25 GPa. More particularly, the particles exhibit an elastic moduli (E) comprised between about 6 GPa and about 10 GPa, and a hardness comprised between about 0.25 GPa and about 1 GPa.

In a wet state, the copolymer and/or terpolymer particles exhibit an elastic moduli (E) higher than 4 GPa and a hardness higher than 0.25 GPa. More particularly, the particles exhibit an elastic moduli (E) comprised between about 4 GPa and about 10 GPa, and a hardness comprised between about 0.25 GPa and about 1 GPa.

The hardness (H) has been determined using nanoindentation measurements by means of a nanoindenter.

The elastic moduli (E) has been determined using nanoindentation measurements by means of a nanoindenter or by AFM (Atomic force microscopy) process.

Nanoindentation measurements refer to a technique similar to conventional hardness testing but performed on a much smaller scale. The force required to press a sharp diamond indenter into a material is measured as a function of indentation depth. As depth resolution is on the scale of nanometers (hence the name of the instrument), it is possible to conduct indentation experiments even on thin films. Two quantities, which can be readily extracted from nanoindentation experiments, are the material's modulus E and its hardness H, which can be correlated to yield strength.

EXAMPLES

Materials used in the following examples are Methyl methacrylate (MMA, 99% purity, Aldrich), Methoxypolyethylene glycol methacrylate (MPEGMA), average molecular weight 454, Aldrich), 4-Vinylpyridine (4-ViPy, 95% purity, Aldrich), 2,2'-Azobis(2-methylpropionamidine) dihydrochloride (97%, Sigma-Aldrich), 4-Vinylpyridine (95% purity, Aldrich). These materials were used as received, without further purification.

pH solutions were prepared using HCl, NaOH, and NaCl (of analytical grade received from Wako Chemical Co.) in a concentration of $10^{-3}$ M as a background electrolyte.

Example 1

Preparation of Polymer Particles as Starting Point

Poly-methylmethacrylate (PMMA)-based spheres were synthesized by a surfactant-free radical free polymerization, using a modification of the procedure described by K. Nishimoto et al. (U.S. Pat. No. 6,582,761).

A typical polymerization procedure was as follows: Methyl methacrylate (MMA), Methoxypolyethylene glycol methacrylate (MPEGMA), and ion-exchanged water (DIW) were charged in a round-bottomed three-necked flask.

In order to prevent aggregation of the particles, a third co-monomer 4-Vinylpyridine (4-ViPy) was added to the system. This solution was heated to 70° C. while stirring.

Afterwards the aza-type polymerization initiator 2,2'-Azobis(2-methylpropionamidine) dihydrochloride (pre-dissolved in water) (APDH) was added to the reaction.

Before the process was initiated, i.e. monomer is added, to eliminate the effects of oxygen, the solution was purged with nitrogen and the reaction was carried out under nitrogen gas atmosphere, until the conversion exceeded 80%-90%, as determined thermo-gravimetrically.

Finally, the system was quenched in a cold-water bath to discontinue the reaction.

The final size of the polymer particles was 367±15 nm (determined by Scanning Electron Microscopy as an average of 100 measurements) and 494±59 nm (determined by Dynamic Light Scattering in water).

Example 2

Post Synthesis Treatment

The dispersions resulting from the synthesis presented in example 1 were centrifuged, the supernatant solutions discarded, and the particles re-suspended in deionised water using ultrasonic treatment. This process was repeated 3 times.

The treatment gave PMMA nanoparticles with positive surface charge ($\zeta$ potential).

The centrifuge/ultrasound cycle is needed for the purification of the particles. The positive surface charge helps the electrostatic stabilization of the particles in solution. More than a reordering occurring during ultrasound treatment the particles are re-dispersed in order to be kept far enough from each other avoiding any agglomeration.

Example 3

Thermal Treatment of Polymer Particles

The thermal treatment method of heating and subsequent cooling is monitored and performed on a Differential Scanning Calorimeter (DSC).

The DSC tool is a thermal analysis instrument that determines the temperature and heat flow associated with material transitions as a function of time and temperature.

The thermal cycle can give information about the percent of crystallinity and the crystallization kinetics and phase transition of a material.

In a heat flux DSC, the sample material, enclosed in a pan and an empty reference pan are placed on a thermoelectric disk surrounded by a furnace. The furnace is heated at a linear heating rate and the heat is transferred to the sample and reference pan through thermoelectric disk. However owing to the heat capacity of the sample there exists a temperature difference between the sample and reference pans which is measured by area thermocouples and the consequent heat flow is determined by the thermal equivalent of Ohm's law: $q=\Delta T/R$, wherein q is the sample heat flow, $\Delta T$, temperature difference between sample and reference, and R, resistance of thermoelectric disk.

The main operations for the measurement are:
calibrating the instrument with Indium and benzophenone of known masses,
selecting the pan type and material,
preparing the sample,
creating or choosing the test procedure and entering sample and instrument information through the TA instrument control software,
setting the purge gas flow rate,
loading the sample and closing the cell lid,
starting the experiment.

For each sample as a solid powder or aqueous colloidal solution the thermal cycle was repeated 2 times. For the study of aqueous solutions above 100° C. hermetic pans were the best choice.

Generally the appropriate mass range for samples in DSC is 1 mg to 10 mg. About 10 mg of solid compounds and 5 wt. % aqueous solutions were used.

An example of the thermal cycle is as follows:
1) Hold for 5 min at 25° C.,
2) Heat from 25C to 200° C. at 10C/min,
3) Hold for 5 min at 200° C.,
4) Cool from 200 C to 25° C. at 15° C./min,
5) Hold for 5 min at 25° C.,
6) Heat from 25 C to 200° C. at 10° C./min,
7) Hold for 5 min at 200° C.,
8) Cool from 200° C. to 25° C. at 15° C./min.

During the thermal heating, the sample preferably remains in a thermal equilibrium, to achieve the thermal equilibrium the heating rate is preferably as slow as possible.

Example 4

Preparation of the Composite Particles

Starting from PPMA nanoparticles obtained with the method of the preferred embodiments to improve the mechanical properties (thermal treatment as described in example 3), composite particles comprising silane-coupling agents between (polymer) core and (silica) shell can be prepared as follows.

An aqueous dispersion containing the PMMA-based particles as previously synthesized was charged in a round-bottomed three-necked flask, (chloromethyl) trimethylsilane was added, and the mixture was stirred at low pH.

This first step leads to an aqueous dispersion of silanized PMMA-based particles that could be added to a colloidal silica particle suspension, to obtain a dispersion of particles in which silica particles had adhered to the polymer ones.

To achieve this, an aqueous dispersion containing the colloidal silica particles (pH 8) was added to the former solution. Vinyltriethoxysilane was added to this aqueous dispersion, the mixture was stirred, and then TEOS was added, heated to 60° C., stirred, and then cooled in a cold water bath.

Thus, an aqueous dispersion containing composite particles was obtained.

The final size of the composite particles (silica shell 30 nm diameter) was 453±27 nm (determined by Scanning Electron Microscopy) and 554±67 nm (determined by Dynamic Light Scattering in water).

Alternatively composite particles can be prepared as follows. An aqueous dispersion containing the PMMA-based particles (pH 2) is mixed with an aqueous dispersion containing the colloidal silica, to obtain an aqueous dispersion (pH 5), and the mixture is stirred to obtain an aqueous dispersion containing the composite particles.

The final size of these alternative composite particles (silica shell 30 nm diameter) is 440±18 nm (determined by Scanning Electron Microscopy) and 567±64 nm (determined by Dynamic Light Scattering in water).

Example 5

Nanoindentation Measurements on Polymer Particles

Figure 7B:
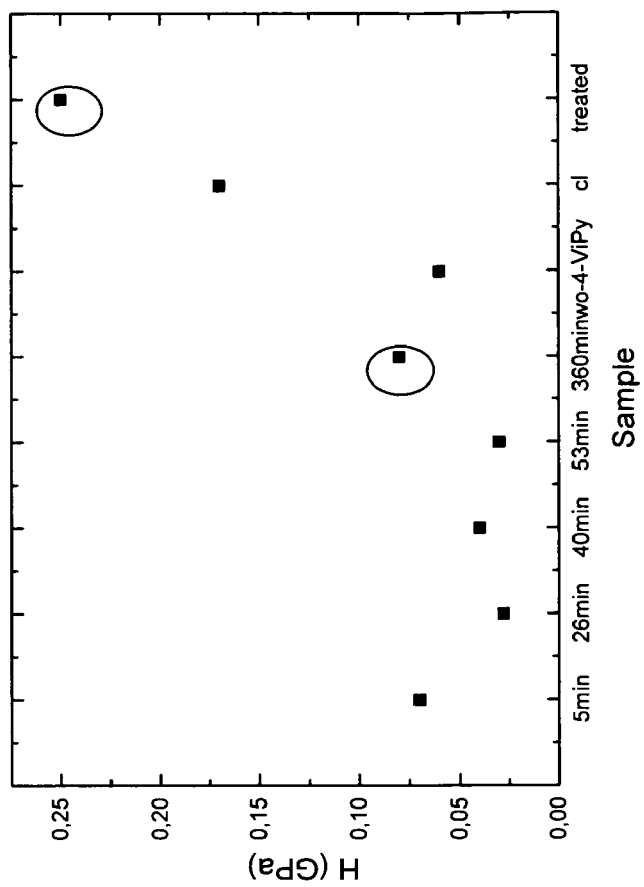
FIG. 7B illustrates the hardness (H) of the material from nanoindentation measurements of a particle layer of about 1 micron for indentation depth of 500 nm (plastic deformation). There is clearly an improvement of the material's H value from 0.08 GPa (untreated TER-P) to 0.25 GPa (treated TER-P).
Figure 7A:
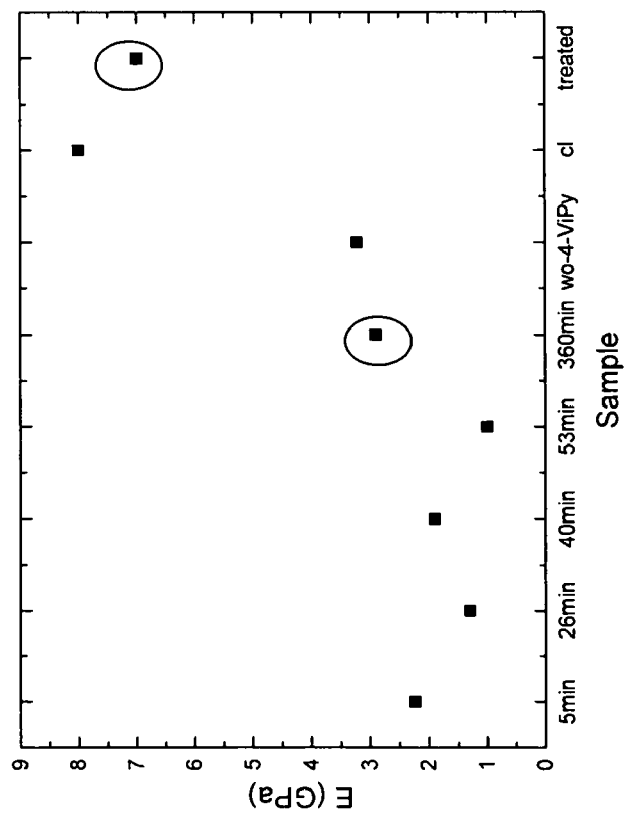
FIG. 7A illustrates the material's modulus (E) from nanoindentation measurements of a particle layer of about 1 micron for indentation depth of 500 nm (plastic deformation). There is clearly an improvement of the E value from 3 GPa (untreated TER-P) to 7 GPa (treated TER-P).

In FIG. 7 material's modulus E and its hardness H data are illustrated from nanoindentation measurements on a layer comprising the polymer particles, the layer having a thickness of about 1 micron (achieved by means of a stapling of the polymer particles) for indentation depth of 500 nm (plastic deformation).

The material's modulus E and its hardness H can be correlated to yield strength.

There is an improvement of the E value from 3 GPa for untreated TER-P polymer particles towards 7 GPa for TER-P polymer particles after thermal treatment of the preferred embodiments.

The hardness (H) value shifted from 0.08 GPa for the untreated TER-P polymer particles towards 0.25 GPa for thermal treated TER-P polymer particles as indicated in FIG. 7B.

FIG. 8 illustrates AFM nanoindentation measurement results performed technique allowed lower indentation depths (below 50 nm) on a TER-P-treated particle monolayer deposited on newly cleaved mica substrate. The measurements were carried out in air and in water.

Figure 8B:
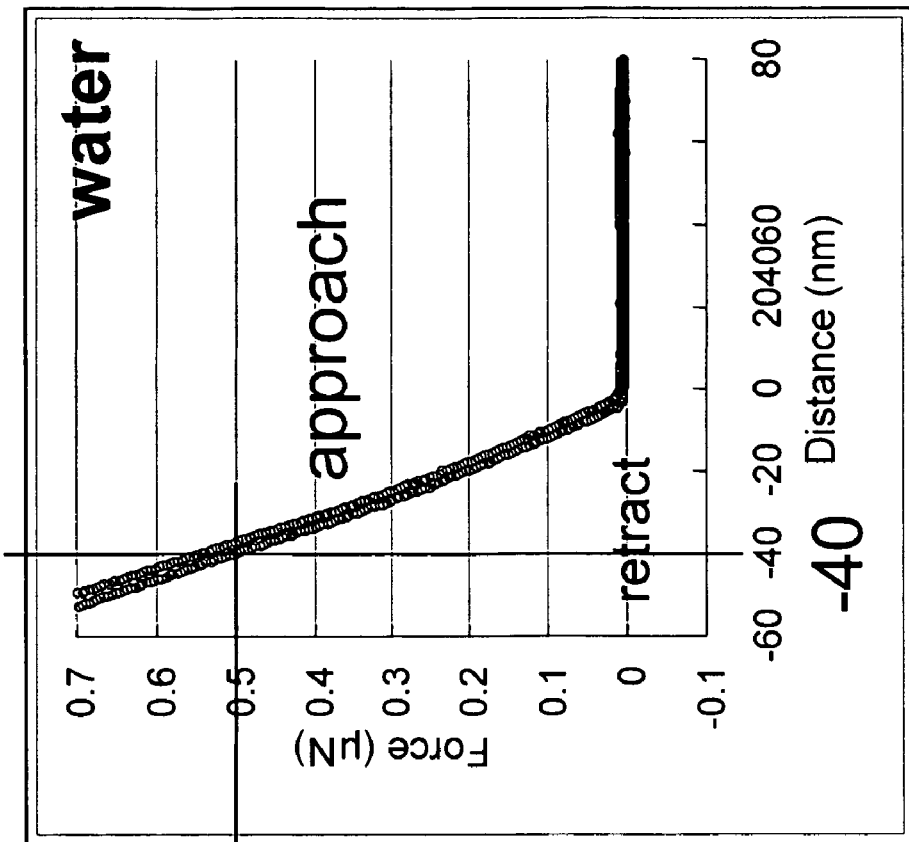
FIG. 8B illustrates a Force-indentation curve after treatment for a TER-P sample in water measured by AFM.
Figure 8A:
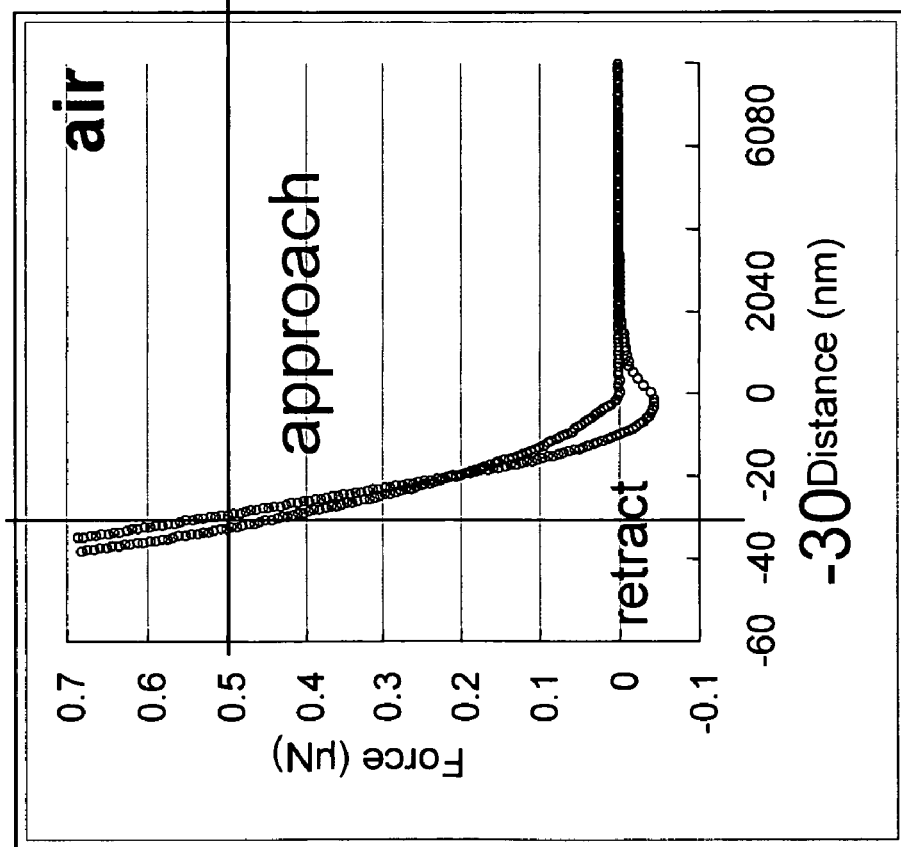
FIG. 8A illustrates a Force-indentation curve for a TER-P sample after treatment in air measured by AFM.

FIG. 8A illustrates a Force-indentation curve for a TER-P sample after treatment in air measured by AFM.

FIG. 8B illustrates a Force-indentation curve for a treated TER-P sample in water measured by AFM.

Figure 8D:
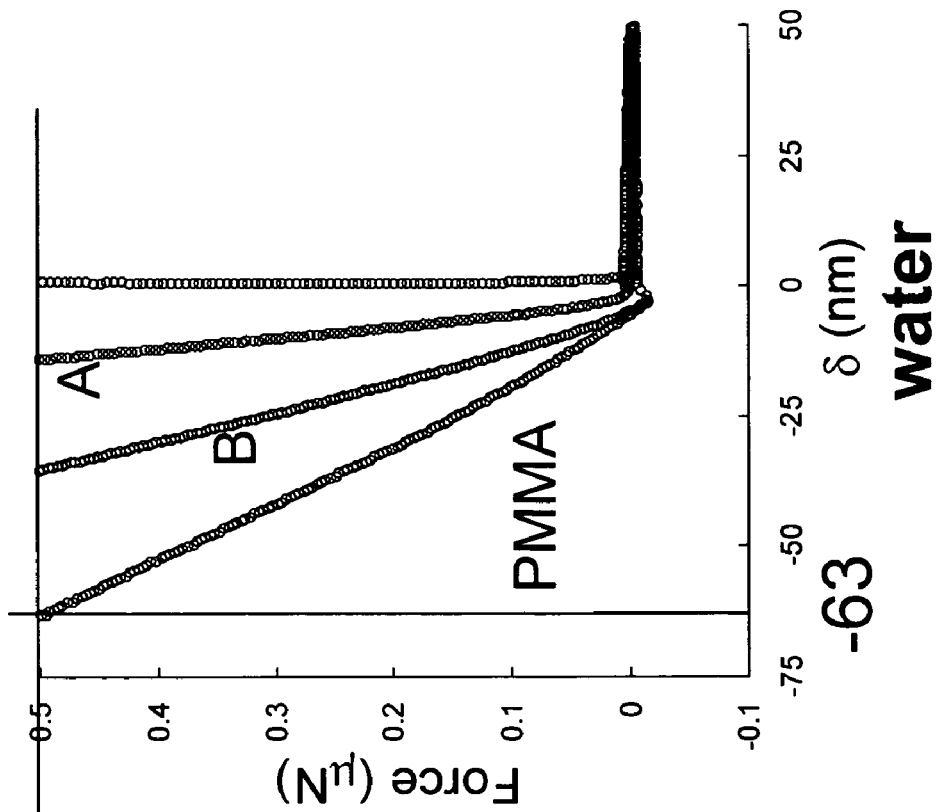
FIG. 8D illustrates a Force-indentation curve for non-treated TER-P samples and composite polymer particles in water measured by AFM.
Figure 8C:
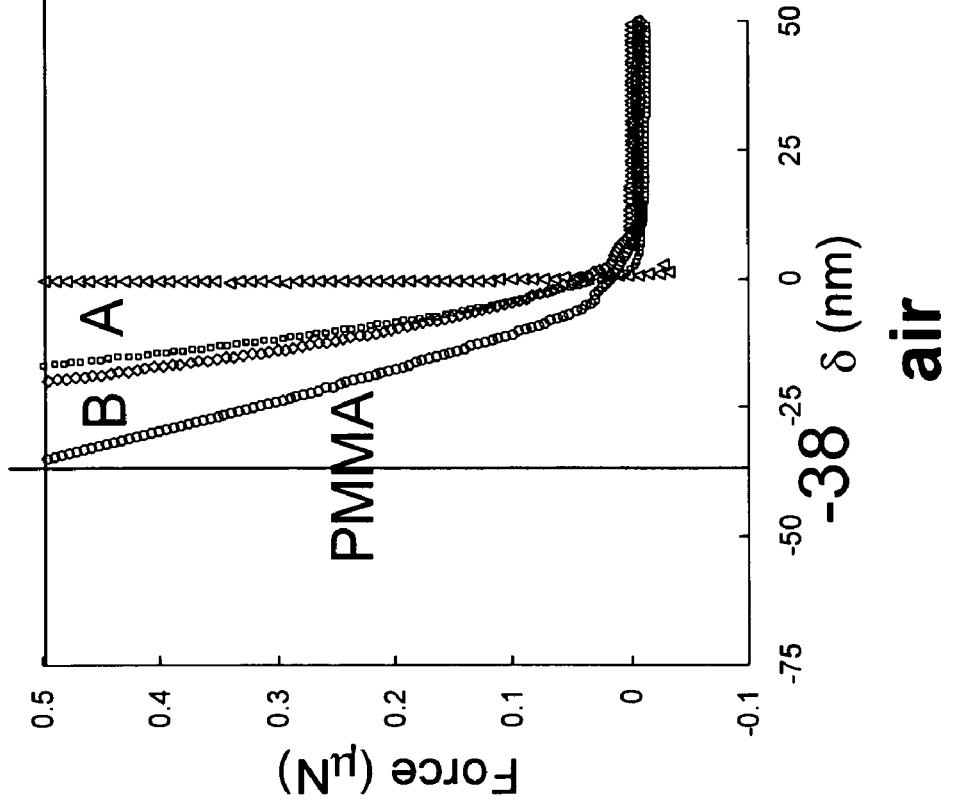
FIG. 8C illustrates a Force-indentation curve for non-treated TER-P samples and composite polymer particles in air measured by AFM.
Figure 8E:
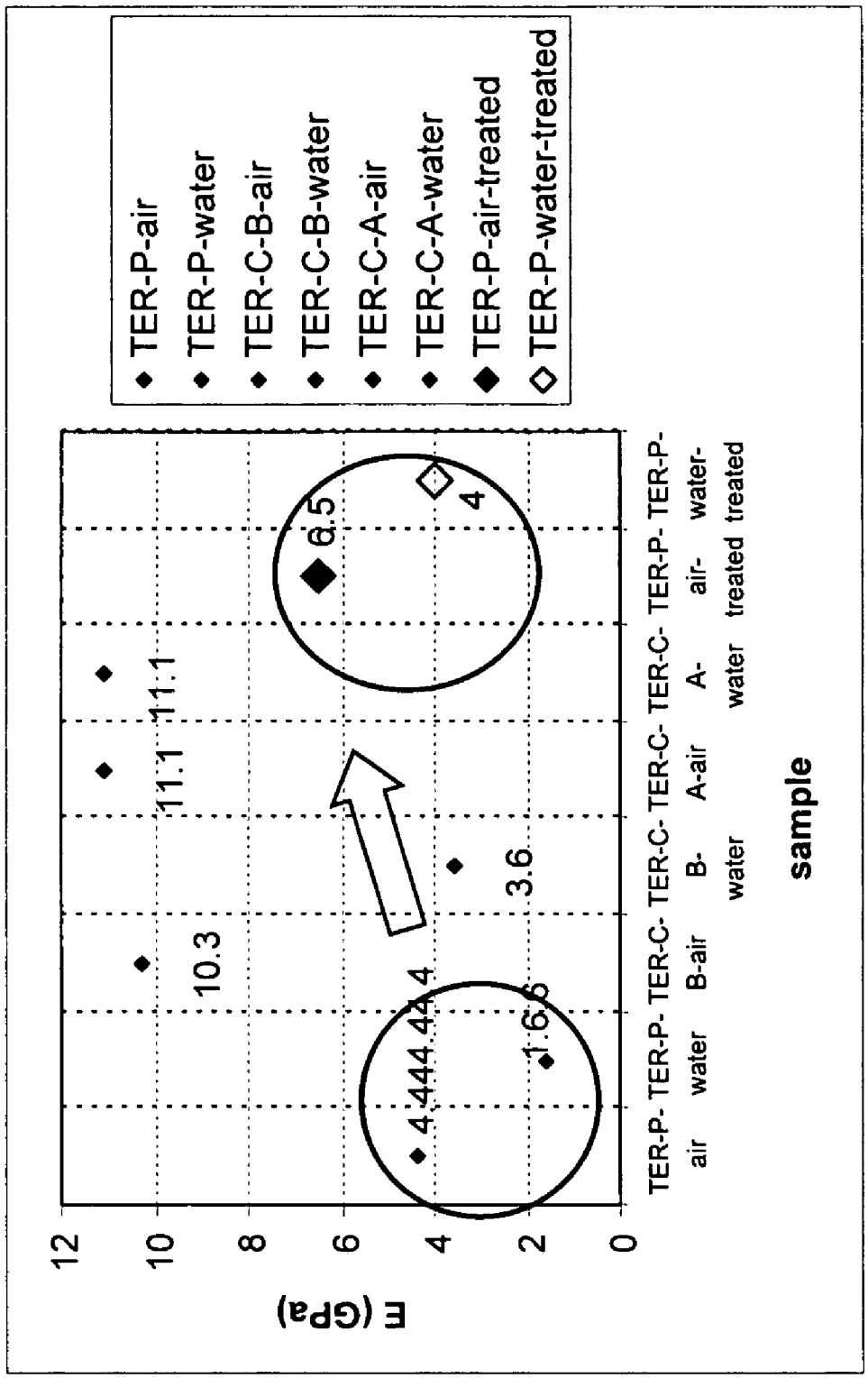
FIG. 8E illustrates calculated elastic moduli (E) from nanoindentation measurements by AFM in air vs. water for a TER-P sample after a thermal treatment (improvement is indicated with arrow).

FIG. 8C illustrates the Force-indentation curves for untreated TER-P and composites TER-C-A and TER-C-B in air measured by AFM as a comparison.

FIG. 8D illustrates the Force-indentation curves for untreated TER-P and composites TER-C-A and TER-C-B in water measured by AFM as a comparison.

The E value (illustrated in FIG. 8E) calculated from the force-indentation curves for treated TER-P samples in water is 4 GPa, in air (dried state after removal of the solvent) it is 6.5 GPa. It is known that solid-state particles are harder compared to wet particles. For the untreated TER-P-particles the E value in water is 1.6 and there is of course also an increase of the E value from 1.6 GPa to 4 GPa in dried state (in air).

To extract quantitative values of Young's modulus from the force-indentation curves, the classical Hertzian contact models can be used from the continuum mechanics of contacts:

$$E_2 = [3F(1-v_2^2)/4\delta^{3/2}][(R_1+R_2)/R_1R_2]^{1/2}$$

wherein $\delta$ is the indentation depth, F is the applied load, $R_1$ and $R_2$ are respectively the radius of curvature of the spherical or parabolic indenter and of the indented particles, and $E_2$ is the surface elastic modulus of the particle (considering that the E for the tip is 130-160 GPa) and $v_2$ is the Poisson ratio of the sample. Because the Poisson ratios of the PMMA-based terpolymer (and the composites) are not known, the Poisson ratio of bulk PMMA ($v_2$=0.38) was used in the calculations.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for increasing a mechanical hardness of polymer particles, the polymer particles comprising hydrophilic groups and hydrophobic groups, the method comprising the step of:
    subjecting the polymer particles to a thermal cycle comprising at least one heating step followed by at least one cooling step, wherein the polymer particles are contained in a polar solvent, whereby a mechanical hardness of the polymer particles is increased, wherein the polymer particles are subjected to a temperature of up to 300° C. during the heating step, and wherein the polymer particles are subjected to a temperature down to 10° C. during the cooling step wherein the polymer particles comprise at least one polymer selected from the group consisting of poly(methyl methacrylate), polystyrene, polypropylene, polyvinylchloride, polyisobutylene, acrylate, methoxypolyethylene glycol methacrylate and 4-vinylpyridine.

2. A method according to claim 1, wherein the polymer particles comprise at least one type of particle selected from the group consisting of copolymer particles and terpolymer particles.

3. A method according to claim 1, wherein a glass transition temperature of the polymer particles is reached or exceeded during the heating step.

4. A method according to claim 1, wherein the polymer particles are subjected to a temperature of up to 200° C. during the heating step, and wherein the polymer particles are subjected to a temperature down to 20° C. during the cooling step.

5. A method according to claim 1, wherein the thermal cycle is performed in a closed reactor, whereby evaporation of the solvent is avoided.

6. A method according to claim 1 for increasing a mechanical hardness of polymer particles, the polymer particles comprising hydrophilic groups and hydrophobic groups, the method comprising the step of:
    subjecting the polymer particles to a thermal cycle comprising at least one heating step followed by at least one cooling step, wherein the polymer particles are contained in a polar solvent, whereby a mechanical hardness of the polymer particles is increased, wherein the polymer particles are subjected to a temperature that is increased at a rate of 5° C. per minute to 10° C. per minute during the heating step.

7. A method according to claim 1 for increasing a mechanical hardness of polymer particles, the polymer particles comprising hydrophilic groups and hydrophobic groups, the method comprising the step of:
    subjecting the polymer particles to a thermal cycle comprising at least one heating step followed by at least one cooling step, wherein the polymer particles are contained in a polar solvent, whereby a mechanical hardness of the polymer particles is increased, wherein the polymer particles are subjected to a temperature that is decreased at a rate of 15° C. per minute to 30° C. per minute during the cooling step.

8. A method according to claim 1, wherein the polar solvent is water.

9. A method according to claim 1, further comprising, after the thermal cycle, a step of coating the polymer particles with an inorganic shell or an inorganic compound.

10. A method according to claim 9, wherein the inorganic shell is silica.

* * * * *

UNITED STATES PATENT AND TRADEMARK OFFICE
CERTIFICATE OF CORRECTION

PATENT NO. : 7,696,273 B2  Page 1 of 1
APPLICATION NO. : 11/585442
DATED : April 13, 2010
INVENTOR(S) : Silvia Armini It is certified that error appears in the above-identified patent and that said Letters Patent is hereby corrected as shown below:

| Issued Patent | Line | Description of Discrepancy |
|---|---|---|
| On the Title page (Item 73) Assignee | | Change "Katholieke Universiteit Leuven, Leuven (KUL)" to --Katholieke Universiteit Leuven (KUL), Leuven--. |
| Sheet 1 of 11 (FIG. 1A) | 6 | Change "MethoxyPolyEthylenGlycolMethAcrylate" to --MethoxyPolyEthyleneGlycolMethAcrylate--. |
| Col. 2 | 48 | Change "methoxypolyethylenglycol-" to --methoxypolyethyleneglycol- --. |
| Col. 2 | 51-52 | Change "methoxypolyethylenglycolmethacrylate" to --methoxypolyethyleneglycolmethacrylate--. |
| Col. 5 | 28 | Change "acid;" to --acid,--. |
| Col. 5 | 53-54 | Change "methoxypolyethylenglycolmethacrylate" to --methoxypolyethyleneglycolmethacrylate--. |
| Col. 5 | 58-59 | Change "methoxypolyethylenglycolmethacrylate" to --methoxypolyethyleneglycolmethacrylate--. |
| Col. 9 | 40-41 | Change "methoxypoly-ethylenglycolmethacrylate" to --methoxypoly-ethyleneglycolmethacrylate--. |
| Col. 15 | 28 (Approx.) | In Claim 1, change "step" to --step,--. |

Signed and Sealed this

Seventeenth Day of August, 2010

David J. Kappos
*Director of the United States Patent and Trademark Office*